(12) United States Patent
Wier

(10) Patent No.: US 6,766,740 B1
(45) Date of Patent: Jul. 27, 2004

(54) APPARATUS AND METHOD USING A UV LIGHT COLLIMATOR TO EXPOSE A PHOTOPOLYMER PLATE

(75) Inventor: Edwin N. Wier, Martinsville, IN (US)

(73) Assignee: Precision Rubber Plate Co., Inc., Indianapolis, IN (US)

(*) Notice: Subject to any disclaimer, the term of this patent is extended or adjusted under 35 U.S.C. 154(b) by 54 days.

(21) Appl. No.: 10/079,467

(22) Filed: Feb. 21, 2002

(51) Int. Cl.[7] .............................................. G03F 7/20
(52) U.S. Cl. ................................. 101/401.1; 430/396
(58) Field of Search ........................... 101/395, 401.1, 101/467; 430/306, 396; 355/78, 85, 99

(56) References Cited

U.S. PATENT DOCUMENTS

| | | | |
|---|---|---|---|
| 4,454,218 A | * | 6/1984 | Dueber et al. ............ 430/277.1 |
| 4,675,702 A | * | 6/1987 | Gerber ........................ 347/233 |
| 4,992,826 A | * | 2/1991 | Nakabayashi ................ 355/84 |
| 5,147,761 A | * | 9/1992 | Wessells et al. ............ 430/306 |
| 5,607,814 A | * | 3/1997 | Fan et al. .................... 430/258 |
| 6,180,325 B1 | * | 1/2001 | Gelbart ....................... 430/397 |
| 6,211,948 B1 | * | 4/2001 | Lullau et al. ................. 355/71 |
| 6,245,487 B1 | * | 6/2001 | Randall ....................... 430/306 |

* cited by examiner

*Primary Examiner*—Stephen R. Funk
(74) *Attorney, Agent, or Firm*—Woodard, Emhardt, Moriarty, McNett & Henry LLP

(57) ABSTRACT

A combination of components and method for collimating ultraviolet light to exposed a photopolymer plate. A polarizing filter is positioned between an ultraviolet light source and a photopolymer plate. The film or other media having the image to be transferred is likewise positioned between the ultraviolet light source and the photopolymer plate. Rays of light are filtered to allow only the passage of rays perpendicular to the outward-facing surface of the photopolymer plate.

13 Claims, 3 Drawing Sheets

APPARATUS AND METHOD USING A UV LIGHT COLLIMATOR TO EXPOSE A PHOTOPOLYMER PLATE

BACKGROUND OF THE INVENTION

The present invention relates generally to the field of printing and more specifically, the control of the exposing light.

DESCRIPTION OF THE PRIOR ART

Photopolymer plate material is available for use for printing images. The plate is photo sensitive to ultraviolet light. Thus, a photonegative is placed between the ultraviolet light source and the photopolymer plate with the ultraviolet light cross links the polymers thereby hardening the image on the plate.

The image on the plate consists of a plurality of pedestals onto which the ink is transferred for printing. A typical prior art photopolymer plate cross section is shown in FIG. 1 illustrating the upraised pedestals 11 having a top ink receptive surface 12 and a downwardly sloping side surface 13 surrounding the pedestal and providing a generally truncated conical configuration for the pedestal. Side surface 13 terminates in a trough 14 extending between the adjacent pedestals, for example, pedestal 11 and 15.

Pedestal side surface 13 is formed by shining ultraviolet light through the film negative and onto plate 10. The bevel angle 16 between side surface 13 and the top surface 12 of the pedestal is relatively small since the ultraviolet light rays are directed against the photopolymer plate at various angles. Thus, side surface 13 is not steep.

Pedestal 11 may be compressed when contacted by an ink roller transferring the ink not only onto surface 12 but also onto side surface 13. When the photopolymer plate is used to transfer the image onto an external surface, the pedestals may again be compressed thereby transferring the ink not only from surface 12 but also surface 13 onto the external surface thereby leaving a ring around the image formed on the final copy composed of the image from the various top surfaces 12 of the various pedestals. The net results is final copy that does not have a sharp and clear image.

In order to provide a sharp clear image, it is desirable to increase angle 16 thereby orienting side surface 13 at a steep angle relative to top surface 12 minimizing any image transferred by the side surfaces 13. Various attempts to provide a steep side surface 13 have tried through the use of multiple ultraviolet light sources positioned above the photopolymer plate Nevertheless, each light source emits rays at a variety of angles with the ultraviolet light still striking the photopolymer plate at different angles. Disclosed herein is a device and method for directing the ultraviolet light perpendicularly against the photopolymer plate.

SUMMARY OF THE INVENTION

One embodiment of the present invention is a combination for use in producing sharp printed images comprising a source of light and a panel positioned to receive the light with the panel containing the image to be printed. A photopolymer printing plate is positioned relative to the panel to receive the light passing therethrough. A collimating filter is positioned relative to the panel and the plate to limit passage of light from the panel onto the plate to substantially parallel rays of light.

Another embodiment of the present invention is a method of transferring an image on a panel onto a printing plate comprising the steps of providing a photopolymer printing plate, aligning a panel having an image thereon with the plate, shining light onto and through the panel to shine onto the plate, and directing the light into rays of light substantially perpendicular to the printing plate exposing the plate.

It is an object of the present invention to provide a photopolymer plate for producing sharp printed images through the use of printing pedestals having steep side surfaces.

A further object of the present invention is to provide an ultraviolet light filter in combination with a photopolymer plate to limit the angle the ultraviolet light strikes the photopolymer plate.

A further object of the present invention is to provide a new and improved method of providing an image on a printing plate.

Related object and advantages of the present invention will be apparent from the following description.

DESCRIPTION OF THE PREFERRED EMBODIMENTS

Figure 1:
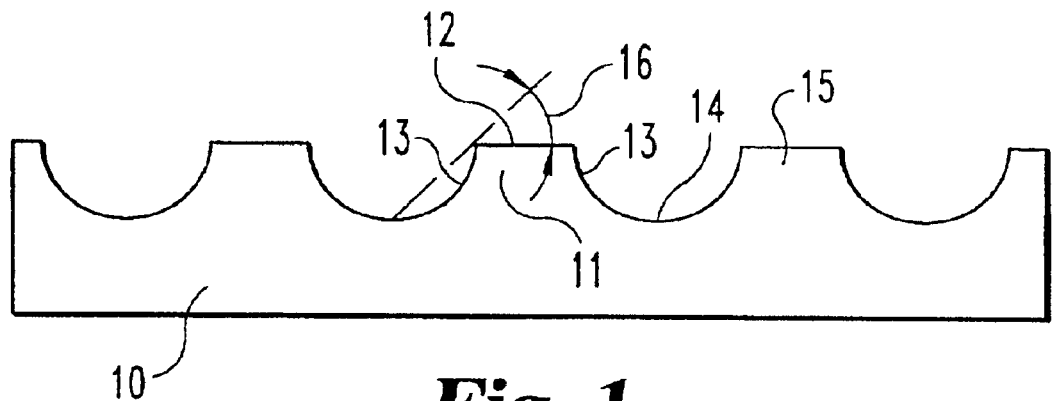
FIG. 1 is an enlarged cross-sectional view of a prior art photopolymer plate formed without filtering the ultraviolet light used to form the image thereon.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Figure 2:
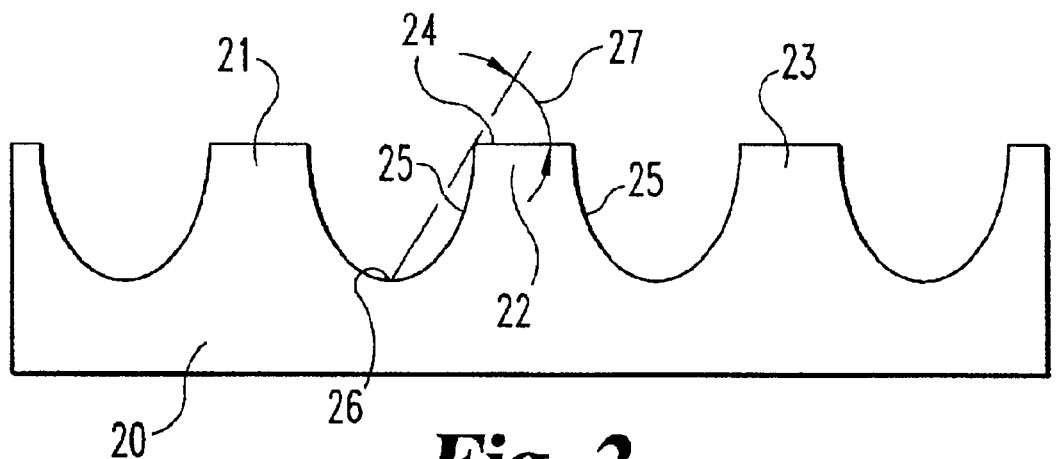
FIG. 2 is the same view as FIG. 1 only illustrating printing pedestals with steep side surface formed by filtering the ultraviolet light forming the image thereon.

Referring now more particularly to FIG. 2, there is shown a photopolymer plate having a plurality of printing pedestals formed thereon including pedestals 21, 22 and 23. Photopolymer plates are commercially available. For example, photopolymer plates may be purchased from Polyfibron Technologies, Inc., 5210 Phillip Lee Drive, Atlanta, Ga. 30336. Each pedestal includes a top surface 24 upon which ink is transferred with the image then being transferred from the plate 20 to the surface to be printed, such as, corrugated boxes, linear board, paper and plastic web stock, and various other packaging materials with the image thereon being composed of the ink transferred from the top surfaces 24 of the various printing pedestals. Extending downwardly from surface 24 are the side surfaces 25 surrounding each pedestal and leading to the trough 26 extending between adjacent pedestals. The angle 27 between side surface 25 and top surface 24 is greater than angle 16 since side surfaces 25 are relatively steep as compared to side surfaces 13. The pedestal side surfaces 13 and 25 tend to be concave and flare out at the floor or trough between adjacent pedestals.

The combination for use in producing a sharp printed image includes a photopolymer printing plate 20, a collimating filter 30, a film 31 having the image thereon and one or more sources of ultraviolet light 32. In the preferred embodiment illustrated in FIG. 3, the collimating filter 30 is positioned between photopolymer plate 20 and film 31 whereas in the alternate embodiment illustrated in FIG. 4, film 31 is positioned between the photopolymer plate 20 and collimating filter 30. In either embodiment, the single source or multiple sources 32 of ultraviolet light 32 shines toward plate 20 with the rays of light leaving the sources 32 at various angles. Collimating filter 30 is in sheet form and thus, is operable to limit passage of rays of light to only rays perpendicularly arranged relative to plate 20 when the filter is parallel to the plate.

Film 31 may be a conventional film negative which has been exposed to the image to be printed thereby creating an opaque portion 34 and a translucent portion 33 on the film. In either embodiment, the light from source 32 shines through the translucent portion 33 of the film negative while being blocked by the opaque portion 34 of film negative 31.

Figure 3:
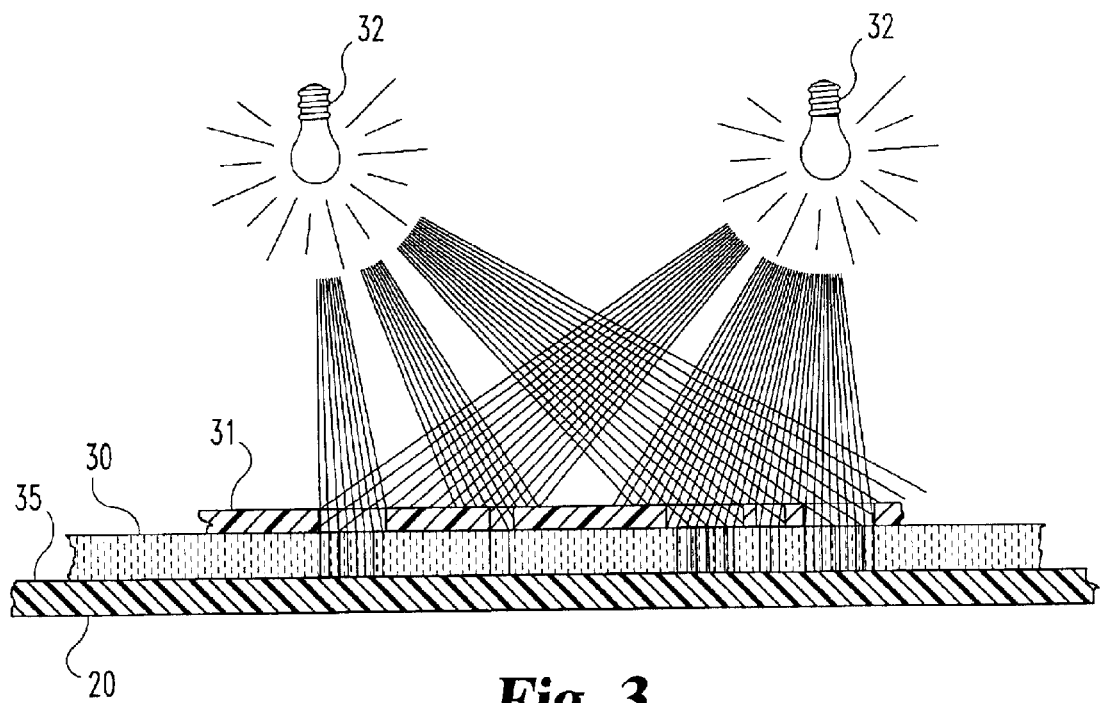
FIG. 3 is a side view of the preferred embodiment illustrating the relationship of the ultraviolet light, film negative, filter and photopolymer plate.
Figure 4:
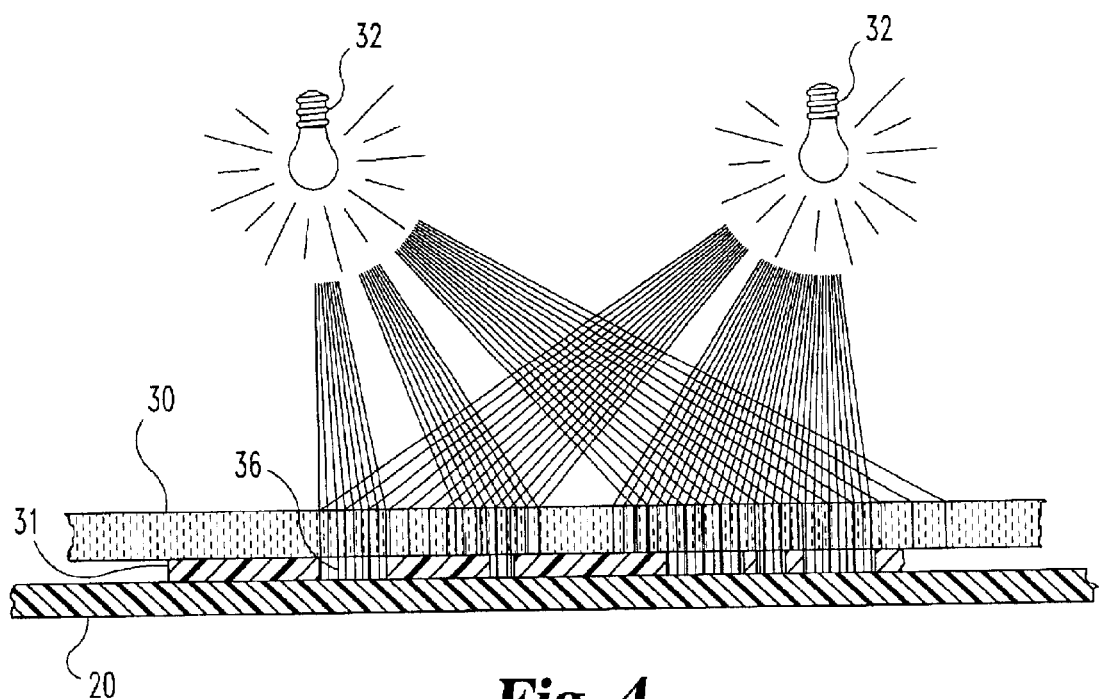
FIG. 4 is the same view as FIG. 3 only illustrating an alternate embodiment wherein the film negative is positioned between the filter and the photopolymer plate.
Figure 5:
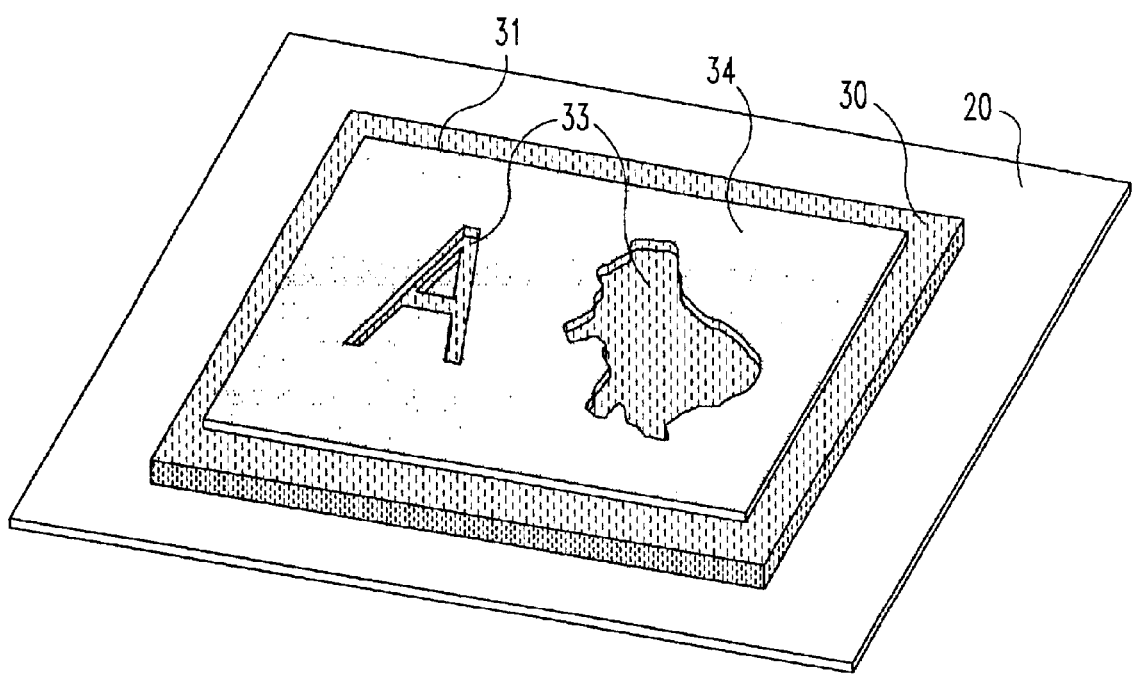
FIG. 5 is a perspective view illustrating the photopolymer plate with filter and negative.

Light collimator 30 is commercially available in sheet form, for example, from International Polarizer, Inc., 320 Elm Street, Marlborough, Mass. 01752 and is identified as a linear polarizer. The linear polarizer is operable to absorb some of the light directed onto the polarizer and allow some of the light to pass therethrough in parallel rays and perpendicular to sheet 31. By placing the linear polarizer 30 atop photopolymer plate 20, only ultraviolet light will pass through polarizer 30 which is directed perpendicular to the upwardly facing surface 35 of plate 20 as viewed in FIG. 3. As a result, the light passing through the translucent portion of film 31 for the embodiment of FIG. 3 will be polarized as the light passes through polarizer 30 striking plate 20 perpendicularly and causing the pedestal side surfaces 25 to be etched creating a relative large angle 27 as compared to the random rays emitted in the prior art technique creating the relatively shallow side surfaces 13. Alternatively, the random ultraviolet rays emitted from light source 32 for the embodiment of FIG. 4 are first passed through polarizer 30 resulting in parallel ultraviolet rays 36 with the rays then passing through the translucent portion of film 31 striking plate 20 perpendicularly. The same result is achieved with the embodiment of FIG. 4 in that angle 27 is relatively large as compared to the prior art technique creating angle 16 thereby allowing the sides of the pedestal to be steeper.

Best results have been obtained by limiting angle 27 to less than 90 degrees. In the event side surfaces 25 are arranged perpendicular to surface 24 then it is possible the pedestals will bend during the transfer of ink either onto or off of surface 24 allowing side surface 25 to create a smudge on the final printed product.

The present invention utilizes the standard technique of holding the film negative 31 to plate 20 by means of a flexible, transparent plastic sheet, known as a kreane sheet, with a vacuum then being applied to hold the flexible sheet to plate 20. For purposes of clarity, such a kreane sheet has not been illustrated in the drawings. In the embodiment of FIG. 3, the kreane sheet may be placed over film 31 and collimating filter 30 with the sheet then being secured by vacuum to plate 20. In the alternate embodiment of FIG. 4, the flexible kreane sheet may be placed between collimating filter 30 and film negative 31 with the kreane sheet then being held to plate 20 by means of a vacuum.

Many variations are contemplated and included in the present invention. For example, an exposed commercially available digital plate may be substituted for the film negative 31 with all of the steps outlined herein being the same. That is, the digital plate may be placed atop collimating filter 30 in lieu of film 31 or may be positioned in the embodiment of FIG. 4 between collimating filter 30 and photopolymer plate 20 taking the place of film 31. The present invention contemplates and includes using either a liquid-resin plate material or a sheet-resin plate material for plate 20. In either case, the collimating filter and film are arranged relative to plate 20 as previously described and illustrated.

Once the method described herein is completed, plate 20 may be cleaned in the conventional manner. The plate is then ready to be mounted to a printing roller for receipt of ink onto surfaces 24 and the subsequent transfer of the ink onto the final printed media producing a clear and sharp image.

Filter 30 is utilized to collimate the UV light source during the photopolymer plate exposure thus gaining the advantages of collimated light without the disadvantages of a conventional polarized UV light source. The exposure technique disclosed herein permits the polarizing film to be placed above or below the cover film (keane film), and can be used for liquid-resin plate material exposure or for sheet-resin plate material exposure whether conventional or digital plate material, to improve the bevel angle on the full range of halftones. By varying the exposure times with and without the polarizing filter mask in place, the angle of the bevel can be adjusted for the specific application.

While the invention has been illustrated and described in detail in the drawings and foregoing description, the same is to be considered as illustrative and not restrictive in character, it being understood that only the preferred embodiments have been shown and described and that all changes and modifications that come within the spirit of the invention are desired to be protected.

What is claimed is:

1. A method of transferring an image on a panel onto a printing plate comprising the steps of:

providing a photopolymer printing plate;

aligning a panel having an image thereon with said plate;

locating a polarizer between said plate and said panel;

shining light onto and through said panel to shine onto said plate; and directing with said polarizer said light into parallel rays of light substantially perpendicular to said printing plate exposing said plate.

2. The method of claim 1 wherein:

said panel is a film; and further comprising the steps of:

exposing said film to an image to be printed thereby creating an opaque portion and a translucent portion on said film; and, wherein:

said shining step shines light through said translucent portion of said film while light is blocked by said opaque portion.

3. A method of transferring an image on a panel onto a printing plate comprising the steps of:

providing a photopolymer printing plate;

aligning a panel having an image thereon with said plate, said panel is a film;

shining light onto and through said panel to shine onto said plate; and directing said light into rays of light substantially perpendicular to said printing plate exposing said plate;

exposing said film to an image to be printed thereby creating an opaque portion and a translucent portion on said film; and, wherein:

said shining step shines light through said translucent portion of said film while light is blocked by said opaque portion;

said directing step includes the step of collimating said light shining on said printing plate; and, said shining step includes the sub-steps of shining light onto and through said film and then through a light polarizer.

4. A combination for use in producing sharp printed images comprising:

a source of light;

a panel positioned to receive light from said source with said panel containing an image to be printed;

a photopolymer printing plate positioned relative to said panel to receive light from said source; and, a collimating filter positioned relative to said panel and said plate to limit passage of light from said panel onto said plate to substantially parallel rays of light passing through said panel, said panel is positioned between and adjacent said plate and said filter.

5. The combination of claim 4 wherein:

said panel is a film.

6. The combination of claim 4 wherein:

said panel is a digitally imaged plate.

7. A combination for use in producing sharp printed images comprising:

a source of light;

a panel positioned to receive light from said source with said panel containing an image to be printed;

a photopolymer printing plate positioned relative to said panel to receive light from said source; and, a collimating filter positioned relative to said panel and said plate to limit passage of light from said panel onto said plate to substantially parallel rays of light passing through said panel, said panel is a film, said film is positioned between and adjacent said plate and said filter.

8. A combination for use in producing sharp printed images comprising:

a source of light;

a panel positioned to receive light from said source with said panel containing an image to be printed;

a photopolymer printing plate positioned relative to said panel to receive light passing therethrough from said source; and, a collimating filter positioned relative to said panel and said plate to limit passage of light from said panel onto said plate to substantially parallel rays of light; and wherein:

said panel is a film; and said filter is positioned between said plate and said film.

9. The combination of claim 8 wherein:

said printing plate is in liquid form.

10. The combination of claim 8 wherein:

said printing plate is in sheet form.

11. A method of producing a printing plate having an image thereon comprising the steps of:

providing a photopolymer printing plate;

placing a panel having an image thereon near said plate;

providing and locating a polarizer between and adjacent said plate and said panel;

shining light onto and through said panel to shine onto said plate; and directing with said polarizer said light into rays of light substantially perpendicular to said printing plate to expose said plate.

12. The method of claim 11 wherein:

said panel is a film; and further comprising the steps of:
   exposing said film to an image to be printed thereby creating an opaque portion and a translucent portion on said film; and, wherein:
      said shining step shines light through said translucent portion of said film while being blocked by said opaque portion.

13. A combination for use in producing sharp printed images comprising:

a source of light;

a panel positioned to receive light from said source with said panel containing an image to be printed;

a photopolymer printing plate positioned relative to said panel to receive light from said source; and, a collimating filter positioned relative to said panel and said plate to limit passage of light from said panel onto said plate to substantially parallel rays of light passing through said panel;

said panel is a film, said filter is placed between and adjacent said film and said plate.

\* \* \* \* \*